United States Patent [19]

Voorman

[11] 4,016,435

[45] Apr. 5, 1977

[54] CURRENT STABILIZING ARRANGEMENT

[75] Inventor: Johannes Otto Voorman, Eindhoven, Netherlands

[73] Assignee: U.S. Philips Corporation, New York, N.Y.

[22] Filed: Feb. 26, 1975

[21] Appl. No.: 553,279

[30] Foreign Application Priority Data

Mar. 11, 1974 Netherlands ...................... 7403202

[52] U.S. Cl. ............................ 307/296 R; 307/297; 307/254; 330/22

[51] Int. Cl.² ........................................ H03K 17/00

[58] Field of Search .......... 307/229, 297, 296, 254, 307/300; 330/30 D, 22

[56] References Cited

UNITED STATES PATENTS

| | | | |
|---|---|---|---|
| 3,740,539 | 6/1973 | Pace | 307/229 |
| 3,906,246 | 9/1975 | Okada | 307/229 |
| 3,909,628 | 9/1975 | Muto | 307/297 |

*Primary Examiner*—Stanley D. Miller, Jr.
*Assistant Examiner*—B. P. Davis
*Attorney, Agent, or Firm*—Frank R. Trifari; Bernard Franzblau

[57] ABSTRACT

A current stabilizing arrangement which includes a three-terminal circuit with an input terminal and an output terminal, at which output terminal a current with a negative temperature coefficient appears, while a constant current is applied to the input terminal. The arrangement further comprises a current source circuit, which supplies a current with a positive temperature coefficient and a squaring circuit to which a current is applied which is proportional to the current of the current source circuit, and whose output current, added to the output currents of the current-source circuit and of the three-terminal circuit, results in a temperature independent current. The temperature independent current thus obtained is applied to the input of a current mirror circuit, whose output current is fed to the input terminal of the three-terminal circuit.

10 Claims, 6 Drawing Figures

CURRENT STABILIZING ARRANGEMENT

The invention relates to a current stabilizing arrangement.

For various purposes current sources are required which provide an accurately adjustable constant current. Such a current source may for example be used as the power supply for an oscillator circuit which produces a signal of constant frequency. Such current sources are also employed in accurate digital-analog converters. To realize a constant current it is a prerequisite that the current source should be independent of temperature variations.

Current sources are known in a multitude of embodiments. Some of these comprise means for eliminating errors caused by temperature variations.

To obtain a high degree of temperature independence the supply voltage in the known current sources should comply with stringent requirements in respect of constancy and temperature independence or use must be made of constant temperature-independent reference voltages or currents (see for example U.S. Patent No. 3,573,504).

It is an object of the invention to realize an adjustable current source which is temperature independent to a high degree, while no stringent requirements have to be imposed on the constancy of the supply voltage and no reference voltage or current is required, with the additional advantage that the arrangement can be realized comparatively simply in the form of a monolithic integrated circuit.

For this, the invention is characterized in that the arrangement includes a three-terminal circuit, known per se, comprising two parallel branches between an input terminal and a common terminal, of which one branch includes at least the collector-emitter path of a first transistor and the other branch at least the base-emitter junction of a second transistor in series with a resistor, the collector of the second transistor being connected to an output terminal and the base of the first transistor being driven with a signal which is derived from the input signal in such a way that for a constant current at the input terminal a current with a negative temperature coefficient appears at the output terminal, a two-terminal circuit, known per se, which comprises two parallel branches, which by means of a current dividing circuit are coupled in such a way that the currents which flow through the two branches are in a fixed ratio to one another, while at least one semiconductor junction which is included in the one branch is by-passed by a series connection of at least one semiconductor junction and a resistor which is included in the other branch, at least one of the two said semiconductor junctions being the base-emitter junction of a transistor, in such a manner that between the terminals of said two-terminal circuit a current with a positive temperature coefficient appears, a current mirror circuit, known per se, whose input terminal is connected to the output terminal of said three-terminal circuit and also to the one terminal of the said two-terminal circuit, whose other terminal is connected to the common terminal of said three-terminal circuit, the output terminal of said current mirror circuit being connected to the input terminal of the three-terminal circuit.

To compensate for higher-order temperature errors, according to a further aspect of the invention, the arrangement may comprise a squaring circuit to which at least a current which is proportional to the current which flows between the terminals of said two-terminal circuit is applied. The squaring circuit has an output circuit in which a current flows which is proportional to the sqaure of the current which flows through said two-terminal circuit. This output circuit connects the input terminal of the first current mirror circuit to the common terminal of said three-terminal circuit.

The invention will be described in more detail with reference to the Figures, of which:

Figure 3:
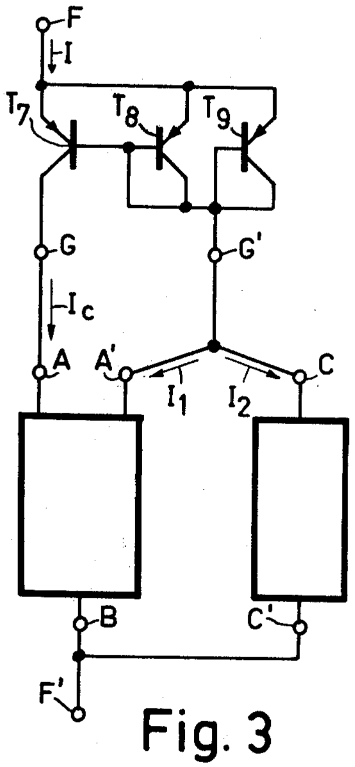
Figure 4:
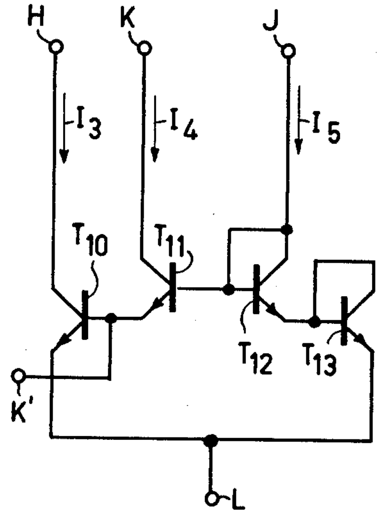
Figure 5:
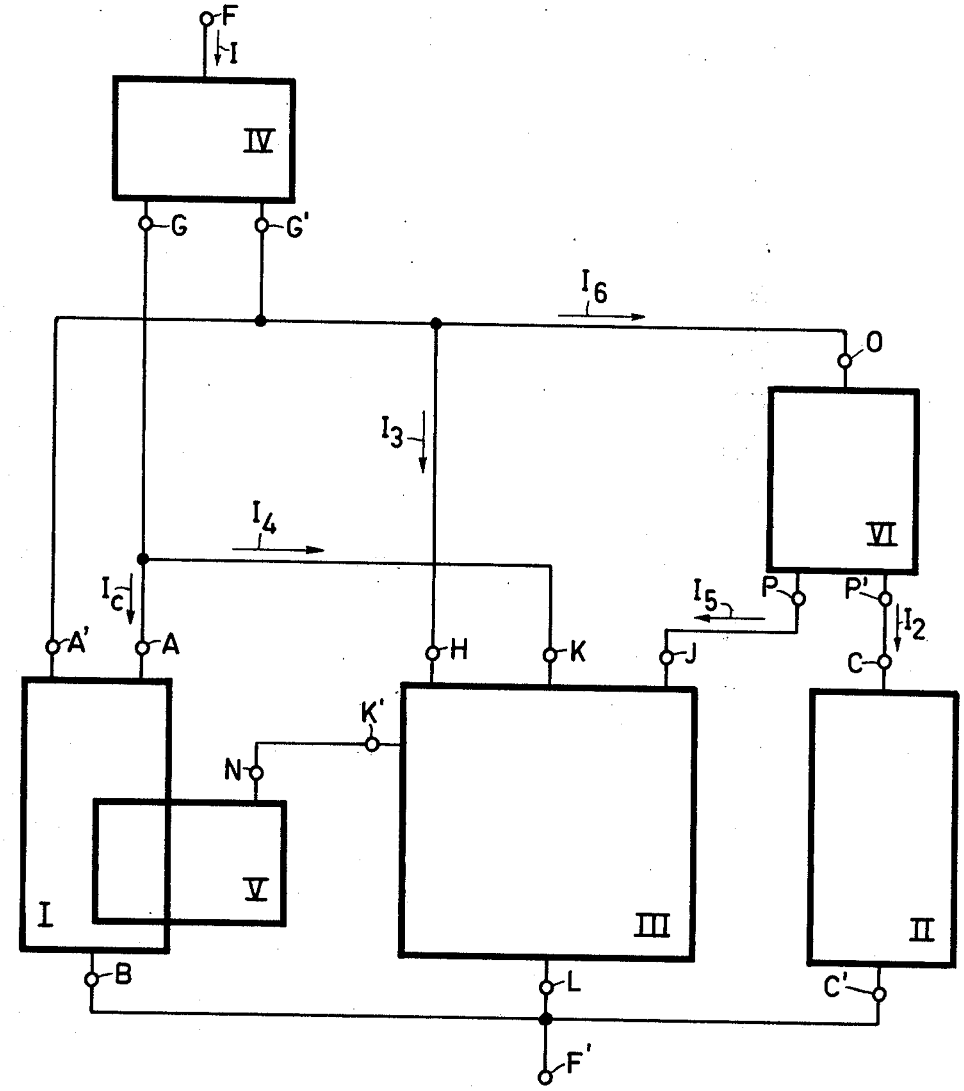
Figure 6:
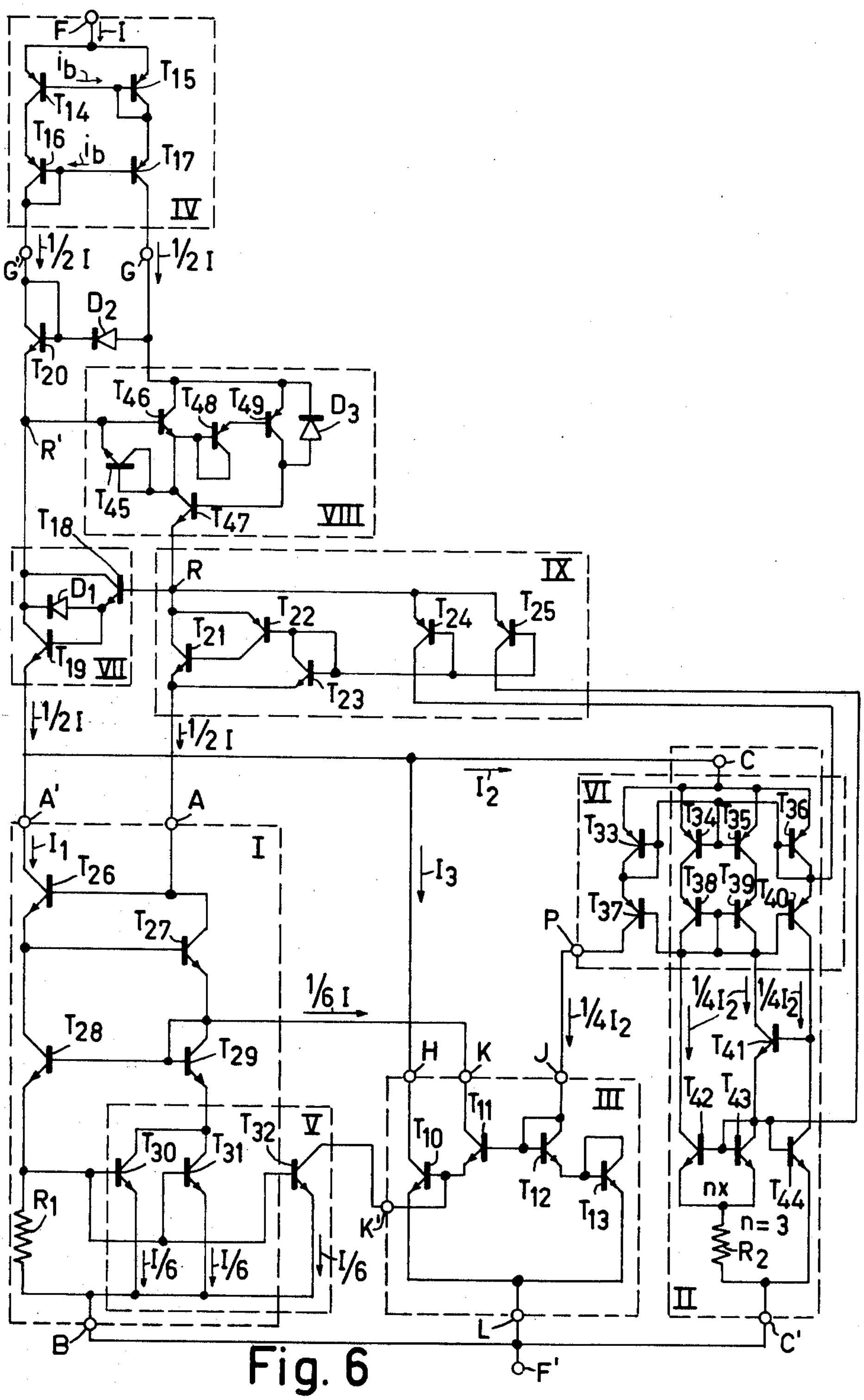

FIG. 3 schematically shows a first embodiment of an arrangement according to the invention, FIG. 4 shows a multiplying circuit, known per se, FIG. 5 schematically shows a second embodiment of an arrangement according to the invention, and FIG. 6 shows a detailed embodiment of an arrangement according to the invention.

Figure 1:
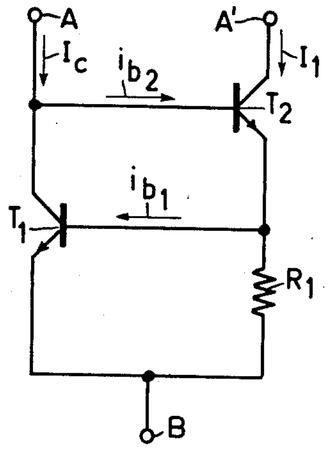
FIG. 1 shows a current source, known per se.

FIG. 1 shows a known current source arrangement which provides a current with a negative temperature coefficient. The circuit arrangement has an input terminal A, an output terminal A', and a common terminal B. A first current path, which is formed between the terminals A and B, comprises the collector-emitter path of a transistor $T_1$, which in the shown example is of the npn-type. A second current path is formed between the terminals A' and B and comprises the collector-emitter path of a transistor $T_2$, of the same conductivity type as the transistor $T_1$, in series with a resistor $R_1$. The base of transistor $T_1$ is connected to the emitter of transistor $T_2$ and thus to one end of the resistor $R_1$, the other end being is connected to the common terminal B. The emitter of transistor $T_1$ is also connected to the terminal B so that the resistor $R_1$ shunts the base-emitter junction of transistor $T_1$. The collector of transistor $T_1$ is connected to the input terminal A, while the collector of transistor $T_2$ is connected to the output terminal A'.

It is assumed that a constant current $I_c$ flows through the terminal A. Through the terminal A' a current $I_1$ flows. When the currents $I_1$ and $I_c$ are of the same order of magnitude, the base currents of the transistors $T_1$ and $T_2$ will be approximately equal, provided that the effective emitter areas of the transistors $T_1$ and $T_2$ are equal. The current which flows through the resistor $R_1$ is then equal to the current $I_1$, which will be evident when the direction of the base currents as shown in FIG. 1 is considered. The current $I_1$ causes a voltage drop $I_1R_1$ across the resistor $R_1$. Said voltage drop is in shunt with the base-emitter junction of transistor $T_1$, and thus equals the base-emitter voltage $V_{be}$ of transistor $T_1$. Expressed in a formula this becomes:

$$I_1 = \frac{V_{be}}{R_1} \quad (1)$$

For $V_{be}$ the known expression is valid:

$$V_{be} = \frac{kT}{q} \ln\left(\frac{I_c}{I_o} + 1\right) \quad (2)$$

where $k$ is the Boltzmann constant,
$T$ the absolute temperature of transistor $T_1$,
$q$ the charge of the electron and
$I_c$ the collector current of transistor $T_1$,
$I_o$ the leakage current of the transistor
when operated in the reverse direction. The current $I_o$ is also temperature dependent, which temperature dependence may be expressed as:

$$I_o = AT\,\overline{n_i^2}\mu_n \qquad (3)$$

in which $n_i^2 = BT^3e^{-qV_{go}/kT}$ $\mu_n = CT^{-n}$ where A, B and C are constants, $\mu_n$ the electron mobility and $V_{go}$ the linearly extrapolated gap voltage at 0° K (see for example "Physics of Semiconductor Devices", by S. M. Sze, page 27, 39, 41, 269). When $I_c/I_o$ is substantially greater than one and with the substitutions D = A.B.C and $\eta_i = 4 - n$, the following equation applies to the base-emitter voltage of transistor $T_1$:

$$V_{be} = V_{go} + \frac{kT}{q}\ln\frac{I_c}{D} - \eta\frac{kT}{q}\ln T \qquad (4)$$

The logarithm of the temperature can be developed around a reference temperature $T_o$ in a Taylor series. Assume that $$T = T_o\left(1 + \frac{\Delta T}{T_o}\right),$$

$V_{beo} = V_{be}(T = T_o)$ and $I_c$ is temperature independent; expression (4) when neglecting components with a temperature dependence of a higher order than $T^2$ may be written as:

$$V_{be} = V_{beo} - \left(V_{go} - V_{beo} + \eta\frac{kT_o}{q}\right)\frac{\Delta T}{T_o} = \tfrac{1}{2}\eta\frac{kT_o}{q}\left(\frac{\Delta T}{T_o}\right)^2 \qquad (5)$$

At increasing temperature it is found that the base-emitter voltage of transistor $T_1$ decreases, so that the current $I_1$, which flows through the output terminal A', decreases. For $I_1$ as a function of temperature the following equation applies, using the expressions (1) and (5):

$$I_{10} = I_1(T = T_o) = \frac{V_{beo}}{R_1}:$$

$$I_1(T) = I_{10} - \left(\frac{V_{go}}{R_1} - I_{10} + \eta\frac{kT_o}{qR_1}\right)\frac{\Delta T}{T_o} - \tfrac{1}{2}\eta\frac{kT_o}{qR_1}\left(\frac{\Delta T}{T_o}\right)^2$$

$$= I_{10} - a\left(\frac{\Delta T}{T_o}\right) - b\left(\frac{\Delta T}{T_o}\right)^2 \qquad (6)$$

in which $a$ and $b$ are positive constants. The current $I_1$ which flows through the output terminal A' consequently has a negative temperature coefficient.

Figure 2:
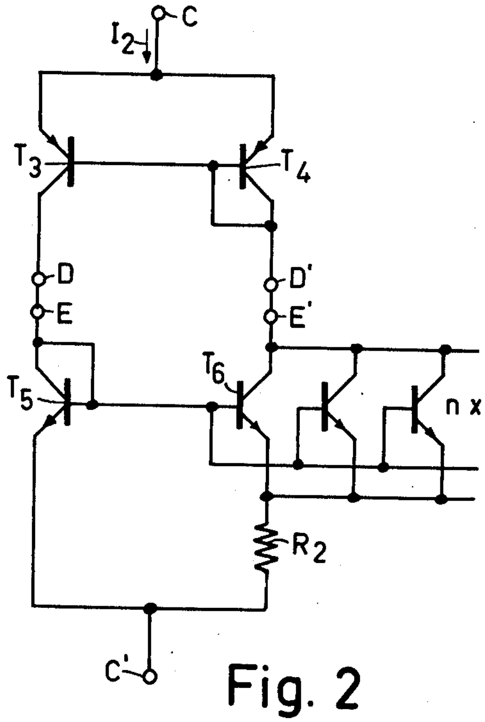
FIG. 2 shows a second current source, known per se.

FIG. 2 shows a known current source, which provides a current with a positive temperature coefficient. The circuit arrangement includes a current mirror with identical transistors, in the shown example of the pnp type, which current mirror circuit has three terminals, namely a sum terminal C and two terminals D and D'. The sum terminal C is connected to the emitters of the transistors $T_3$ and $T_4$, while the base of transistor $T_3$ is connected to the base of transistor $T_4$. The transistor $T_4$ operates as a diode in that the base and the collector are interconnected. The collector of transistor $T_3$ is connected to the terminal D so that the emitter-collector path of transistor $T_3$ constitutes a first current path between the terminals C and D. Similarly, the collector-emitter path of the transistor $T_4$ constitutes a second current path between the terminals C and D'.

The current source further includes a second circuit which has three terminals, viz. the terminals E and E' and a sum terminal C'. The terminals E and E' are connected to the terminals D and D' of the current mirror circuit respectively. The second circuit comprises identical transistors of a conductivity type which is opposite to that of the transistors of the current mirror circuit. The collector-emitter path of a transistor $T_5$ connects the terminals E and C', the emitter of transistor $T_5$ being connected to the terminal C'. The transistor $T_5$ is connected as a diode by means of the collector-base connection. The terminal E' is connected to the sum terminal C' via the parallel-connected collector-emitter paths of a number of a transistors $T_6$, $n$ resistor $R_2$ being included in the common emitter circuit. Said number of $n$ transistors may be replaced by one transistor having an n-fold effective emitter area. The common base circuit of the transistors $T_6$ is connected to the base of transistor $T_5$.

When the base currents are initially neglected, the current which flows through each of the terminals D and D' will equal half the current $I_2$ which flows through the sum terminal C because the base-emitter junctions of the transistors $T_3$ and $T_4$ are connected in parallel. The current $\tfrac{1}{2}I_2$ which flows through the collector-emitter path of transistor $T_5$ causes a base-emitter voltage which equals:

$$\frac{kT}{q}\ln\frac{I_2}{2I_o}.$$

The current $\tfrac{1}{2}I_2$, which flows between the terminals E' and C', is equally distributed among the $n$ identical transistors so that the base-emitter voltage of each of said transistors equals:

$$\frac{kT}{q} \ln \frac{I_2}{2nI_o}.$$

The current $\frac{1}{2}I_2$ moreover causes a voltage drop which equals $\frac{1}{2}I_2R_2$ across the resistor $R_2$. The base-emitter voltage of transistor $T_5$ should equal the sum of the base-emitter voltage of one of the *n* transistors $T_6$ and the voltage drop across the resistor $R_2$, so that some calculations will yield the current $I_2$:

$$I_2 = 2\frac{kT}{qR_2} \ln n \quad (7)$$

Starting from the reference temperature $T_0$, the following may be assumed in respect of the temperature dependence of $I_2$:

$$I_2(T) = I_{20}\left(1 + \frac{\Delta T}{T_o}\right) = I_{20} + c\frac{\Delta T}{T_o} \quad (8)$$

with $$I_{20} = 2\frac{kT_o}{qR_2} \ln n = c.$$

In expression (8) *c* is a positive constant so that $I_2(T)$ has a positive temperature coefficient. By means of the current $I_2$ the first order temperature dependence of the current $I_1(T)$ of the current source of FIG. 1 can be compensated by equalizing the constant *c* and the constant a with the aid of the resistors $R_1$ and $R_2$. Then, only the constant current $I_c$ is to be provided yet. If the second-order dependence of $I_1(T)$ is neglected, said current can be derived from the current $I_1(T) + I_2(T)$, which is now constant, with the aid of a current mirror circuit.

FIG. 3 is a schematic representation of a circuit arrangement which, in a first-order approximation, provides a temperature independent current. The arrangement includes a current mirror circuit which consists of the identical transistors $T_7$, $T_8$ and $T_9$, which in the shown example are of the pnp-type. The emitters of the three said transistors are connected to a sum terminal F, while the collector of transistor $T_7$ is connected to an output terminal G and the collectors of the transistors $T_8$ and $T_9$ to an input terminal G'. The transistors $T_8$ and $T_9$ are again connected as diodes, the bases of the transistors $T_8$ and $T_9$ being connected to the base of transistor $T_7$. The arrangement further comprises the current sources of FIG. 1 and FIG. 2, whose terminals are designated correspondingly. The terminal A of the first current source circuit is connected to the terminal G, while the terminal A' is connected to the terminal G'. The terminal C of the second current source circuit is connected to the terminal G', while the terminal C' is connected to the terminal B.

The current mirror circuit in the present example provides a current $I_c$ which equals $\frac{1}{2}(I_1+I_2)$. The ratio 1:2 has been selected for the current mirror so as to enable a current $I_1$ of the same order of magnitude as the current $I_c$ to be realized. As the base-emitter junctions of the transistors $T_7$, $T_8$ and $T_9$ are connected in parallel, the currents through the collector circuits of the transistors $T_7$, $T_8$ and $T_9$ will be equal. As the transistors $T_8$ and $T_9$ have a common collector circuit, the current which flows through the terminal G equals half the current which flows through the terminal G'. Said last-mentioned current divides into the currents $I_1$ and $I_2$, the current which flows through the terminal G being equal to $I_c$. The currents $I_1$ and $I_2$ are determined by the expressions (6) and (8) respectively. The sum of the currents $I_1$ and $I_2$ in a first-order approximation is temperature independent if $a = c$. The expressions (6) and (8) yield the condition:

$$2\frac{kT}{qR_2} \ln n = \frac{V_{g0}}{R_1} - I_{10} + \eta\frac{kT_o}{qR_1} \quad (9)$$

In this case the sum of the currents $I_1(T)$ and $I_2(T)$ is:

$$I_1(T) + I_2(T) = I_{10} + I_{20}$$
$$= I_{10} + 2\frac{kT}{qR_2} \ln n \quad (10)$$

Substitution of (9) in (10) yields:

$$I_1(T) + I_2(T) = \frac{V_{g0}}{R_1} + \eta\frac{kT_o}{qR_1} \quad (11)$$

When condition (9) is satisfied the sum of the currents $I_1(T)$ and $I_2(T)$, which sum flows through the terminal G', appears to be temperature independent in a first-order approximation. Adjustment of the circuit arrangement of FIG. 3 is simple and is effected as follows:

With the aid of expression (11) the value of the resistor $R_1$ is determined for the desired value of the sum current $I_1(T) + I_2(T)$. The resistor $R_2$ dictates the value of the current $I_2(T)$ and thus the value of the sum current. When $R_2$ is subsequently adjusted until the sum current has reached the desired value, condition (9) is automatically satisfied, since condition (9) has resulted in the equation (11), which equation determined the value of the resistor $R_1$.

To compensate for the second-order temperature dependence of $I_1(T)$, use can be made of the circuit arrangement of FIG. 4.

FIG. 4 shows a squaring circuit, which consists of four identical transistors $T_{10}$, $T_{11}$, $T_{12}$ and $T_{13}$, which in the present example are of the npn-type. The circuit has three terminals H, K and J, which are connected to the collectors of the transistors $T_{10}$, $T_{11}$ and $T_{12}$ respectively. A terminal K' is connected to the emitter of transistor $T_{11}$ and a terminal L is connected to the emitters of the transistors $T_{10}$ and $T_{13}$. The transistors are arranged so that the base-emitter junctions of the transistors are connected in series and in series-opposition respectively to form a closed loop. The base of transistor $T_{10}$ is connected to the emitter of transistor $T_{11}$, the base of transistor $T_{11}$ is connected to the base of transistor $T_{12}$, which transistor is connected as a diode, and the emitter of transistor $T_{12}$ is connected to the base of transistor $T_{13}$ which also is connected as a diode.

From the circuit arrangement of FIG. 4 it can be inferred that the sum of the emitter-base voltages of the transistors $T_{11}$ and $T_{12}$ should equal the sum of the base emitter voltages of the transistors $T_{12}$ and $T_{13}$. As is indicated in the Figure, it is assumed that in the collector circuit of transistor $T_{10}$ a current $I_3$ flows, in the collector circuit of transistor $T_1$ a current $I_4$, and in the collector circuit of transistor $T_{12}$ a current $I_5$. Using the known expression for the base-emitter voltage of a transistor, it follows that:

$$\frac{kT}{q}\ln\frac{I_3}{I_o}+\frac{kT}{q}\ln\frac{I_4}{I_o}=\frac{kT}{q}\ln\frac{I_5}{I_o}+\frac{kT}{q}\ln\frac{I_5}{I_o} \quad (12)$$

from which it follows for $I_3$ that $$I_3=\frac{I_5^2}{I_4} \quad (13)$$

The current $I_3$ is given the desired dependence on the square of the temperature by selecting $I_5$ proportional to $I_2(T)$ and $I_4$ proportional to the constant current $I_c$, as is indicated in FIG. 5.

FIG. 5 shows a schematic representation of a circuit arrangement which realizes current which is temperature independent both in the first and in the second order. The arrangement consists of a first current source I in accordance with FIG. 1, a second current source II in accordance with FIG. 2, a squaring circuit III in accordance with FIG. 4, a first current mirror circuit IV, a second current mirror circuit V, and a third current mirror circuit VI. The terminals of the circuits I through IV are designated in accordance with FIGS. 1, 2 and 4. The output terminal G of current mirror circuit IV is connected to the input terminal A of current source circuit I and the input terminal G' to the output terminal A' of the current source circuit I, to the output terminal H of the squaring circuit III and to the terminal O of the current mirror circuit VI. Between the output terminal N of the current mirror circuit V and the common terminal B of the current circuit I at least the collector-emitter path of a transistor is included whose base-emitter junction is by-passed by the base-emitter junction of the transistor $T_1$ of the first current source circuit, so that at the output terminal N a current appears which is proportional to the input current $I_c$ of the first current source circuit and which current is assumed to equal $1/p\ I_c$. The output terminal N is connected to the terminal K' of the squaring circuit, the terminal k being connected to the input terminal A of the current source circuit I. The current mirror circuit VI comprises two terminals P and P', which are respectively connected to the input terminal J of the squaring circuit III and the sum terminal C of the current source II. The common terminal B of the current source I is connected to the sum terminal C' of the current source II and the terminal L of the squaring circuit III.

The current mirror circuit V realizes a current $I_4$, which bears a fixed ratio of 1:p to the current $I_c$, and the current mirror circuit VI realizes in known manner two currents $I_5$ and $I_2$ in a ratio of 1:r. The currents $I_c$, $I_4$, $I_5$ and $I_2$, as well as the currents $I_1$ and $I_3$ correspond to the relevant currents in FIGS. 1 through 4. Substitution of $I_4 = 1/p\ I_c$ and $I_5 = 1/r\ I_2$ in expression (13) yields the output current $I_3$ of the squaring circuit:

$$I_3=\frac{pI_2^2}{r^2I_c} \quad (14)$$

When the expression (8) for the current $I_2$ is substituted therein, it follows for the temperature dependent current $I_3(T)$ that:

$$I_3(T)=\frac{p}{r^2I_c}I_{20}^2\left(1+\frac{\Delta T}{T_o}\right)^2 \quad (15)$$

With $$I_{30}=I_3(T=T_o)=\frac{p}{r^2I_c}I_{20}^2$$

it follows that:

$$I_3(T)=I_{30}\left\{1+2\frac{\Delta T}{T_o}+\left(\frac{\Delta T}{T_o}\right)^2\right\} \quad (16)$$

When the current mirror circuit IV realizes two equal currents, the total current I, which flows between terminals F and F', will be:

$$I=2(I_1+I_3+I_6)=2\left(I_1+I_3+\frac{1+r}{r}I_2\right) \quad (17)$$

If said current is required to be temperature independent, the following should be valid (using expressions (6), (8) and (16)):

$$\frac{V_{go}}{R_1}-I_{10}+\eta\frac{kT_o}{qR_1}=\frac{1+r}{r}I_{20}+2I_{30} \quad (18)$$

and $$\tfrac{1}{2}\eta\frac{kT_o}{qR_1}=I_{30} \quad (19)$$

Substitution of (19) and (18) reduces this to:

$$\frac{V_{go}}{R_1}-I_{10}=\frac{1+r}{r}I_{20} \quad (20)$$

$$\tfrac{1}{2}\eta\frac{kT_o}{qR_1}=I_{30} \quad (21)$$

The following then applies to the current I:

$$I=2\left(I_{10}+I_{30}+\frac{1+r}{r}I_{20}\right) \quad (22)$$

By adjustment of the resistors $R_1$ and $R_2$ and by a suitable choice of the values of $p$ and $r$ the equations (20), (21) and (22) can be satisfied. Since there are various modifications to the basic principle of FIG. 5, the solution of the equations (20), (21) and (22) can best be explained with reference to a detailed drawing of an embodiment of the arrangement according to FIG. 5.

FIG. 6 shows an embodiment of an arrangement according to the invention. The various circuits are designated in accordance with FIG. 5. The circuit arrangement moreover includes the circuits VII through IX. The input terminal F is connected to a current mirror circuit IV, which has an input terminal G' and an output terminal G. The circuit consists of four transistors $T_{14}$, $T_{15}$, $T_{16}$ and $T_{17}$, of which transistors $T_{15}$ and $T_{16}$ are connected as diodes. As the base-emitter junctions of $T_{14}$ and $T_{15}$ are connected in parallel, the circuit provides two equal currents between the terminals F and G' and between the terminals F and G. When the current which flows through the terminal F equals I, the currents flowing through the terminals G' and G will equal ½I. The circuit IV compensates for the base currents $i_b$, as will appear from the Figure. The terminal G' is connected to the output terminal A' of the first current source I, the sum terminal C of the second current source II and the terminal H of the squaring circuit III, all via the collector-emitter path of a transistor $T_{19}$ which forms part of the Darlington pair consisting of the transistors $T_{18}$ and $T_{19}$. Via an isolating circuit VIII and via the collector-emitter path of transistor $T_{21}$, which forms part of a starting circuit IX, the terminal G is connected to the input terminal A of the first current source I. Between the output terminal A' and the common terminal B of the first current source circuit I is the series connection including the collector-emitter junctions of the transistors $T_{26}$ and $T_{28}$ and the resistor $R_1$. Between the input terminal A and the common terminal B the series connection including the collector-emitter path of the transistor $T_{27}$, the collector-emitter path of the transistor $T_{29}$ which is connected as a diode, and the parallel-connected collector-emitter paths of the transistors $T_{30}$ and $T_{31}$. The resistor $R_1$ by-passes the parallel-connected base-emitter junctions of the transistors $T_{30}$ and $T_{31}$. The transistors $T_{30}$ and $T_{31}$ together with the transistor $T_{32}$ constitute the current mirror circuit V. The base-emitter junction of transistor $T_{32}$ is connected in parallel with the base-emitter junction of the transistor $T_{31}$. The collector of transistor $T_{32}$ is connected to the output terminal N of the current mirror circuit V, which terminal N is connected to the terminal K' of the squaring circuit III, which is identical to the circuit of FIG. 4. The terminal K of the squaring circuit III is connected to the emitter of transistor $T_{27}$. The input terminal J of the squaring circuit III is connected to the output terminal P of the current mirror circuit VI. The current mirror circuit VI is combined with the current mirror circuit which is associated with the second current source II, and is based on the same principle as the current mirror circuit VI. The current mirror circuit VI supplies four identical currents, each being a quarter of the current $I_2$ which flows through the sum terminal C of current source circuit II. The starting circuit IX consists of a current mirror circuit which consists of the parallel-connected base-emitter junctions of the transistors $T_{22}$, $T_{24}$ and $T_{25}$. The collector-emitter path of transistor $T_{22}$ supplies the base current which flows into the base of transistor $T_{21}$. The collector-emitter path of transistor $T_{21}$ is included in the current path which connects the terminals G and A. The base of transistor $T_{22}$ is connected to the emitter of transistor $T_{21}$ via the transistor $T_{23}$ which is connected as a diode. The emitters of the transistors $T_{22}$, $T_{24}$ and $T_{25}$ are connected to the collector of transistor $T_{21}$. The collector of transistor $T_{24}$ is connected to the common base circuit of the transistors of the first stage of the current mirror circuit VI and the collector of transistor $T_{25}$ is connected to the base of transistor $T_{44}$. The isolating circuit VIII consists of the series-connected collector-emitter paths of the transistors $T_{46}$ and $T_{47}$ which are included in the current path between the terminal G and the starting circuit IX, the base-emitter junction of transistor $T_{46}$ being by-passed by the transistor $T_{45}$ which is connected as a diode. The collector-emitter path of transistor $T_{46}$ is by-passed by the series-connected emitter-base paths of the transistors $T_{48}$ and $T_{49}$, the transistor $T_{48}$ being connected as a diode and the collector of transistor $T_{49}$ being connected to the base of transistor $T_{47}$. The base of transistor $T_{46}$ is connected to the emitter of the transistor T20 which is connected as a diode and which is included in the current path between the terminal G' and the Darlington circuit VII. The collector-emitter junctions of the transistors $T_{18}$ and $T_{49}$ are by-passed by the diodes $D_1$ and $D_3$, which are connected in the reverse direction in order to prevent oscillations. Similarly, a diode $D_2$ is included between the collector of $T_{17}$ and the base of $T_{20}$. The second current source circuit II is a modified version of the current source circuit of FIG. 2, with the proviso that the current mirror circuit consists of two stages and that the current path between the sum terminal C and the resistor $R_2$ is duplicated. The transistors $T_{42}$ and $T_{43}$ are provided in n-fold, i.e. each of the transistors $T_{42}$ and $T_{43}$ consists of a number of $n$ identical transistors whose emitters, collectors and bases are interconnected. The transistors $T_{42}$ and $T_{43}$ may alternatively consist of single transistors with n-fold effective emitter areas.

The current mirror circuit IV divides the desired current I which flows through the terminal F into two equal currents ½I, which flow through the terminals G and G'. The current ½I, which flows between the terminals G' and A', is divided into the currents $I_1$, $I_2$ and $I_3$, which currents are respectively applied to the terminal A' of the current source I, the terminal C of the current source II, and the terminal H of the squaring circuit III. Hence, the first equation is:

$$I_1 + I_2 + I_3 = \tfrac{1}{2}I \qquad (23)$$

The current ½I, which flows between the terminals G and A, is equally distributed among the collector-emitter paths of the transistors $T_{30}$, $T_{31}$ and $T_{32}$ of the current mirror circuit V. As a result, the current through the input terminal K of the squaring circuit III is 1/6 I. The current through the collector-emitter path of transistor $T_{30}$ is also 1/6 I. The current $I_1$ flows through the resistor $R_1$. As the resistor $R_1$ by-passes the base-emitter junction of transistor $T_{30}$, the following will apply to $I_1$:

$$I_1 = \frac{V_{be}}{R_1} \qquad (24)$$

Expressions (4) and (5) are valid for $V_{be}$, with $I_c = 1/6$ I. The current $I_2$ is divided into four equal parts by the current mirror circuit VI, so that a current ¼$I_2$ will flow through the input terminal J of the squaring circuit III. In a similar way as for expression (13) it follows for $I_3$:

$$I_3 = \frac{6I_2^2}{16I} \qquad (25)$$

As the transistors $T_{42}$ and $T_{43}$ of current source II are provided in n-fold, a current of ¼n $I_2$ will flow through the collector-emitter path of each of the transistors $T_{42}$ and $T_{43}$. A current of $\frac{1}{2}I_2$ will then flow through the resistor $R_2$. In a similar way as expression (7) has been derived, it follows for $I_2$:

$$I_2 = 2\frac{kT}{qR_2}\ln n \qquad (26)$$

in which in the present embodiment $n = 3$. Similarly to the expressions (6), (8) and (16) the temperature dependence of $I_1$, $I_2$ and $I_3$ may be represented by the following equations:

$$I_1(T) = I_{10} - \left(\frac{V_{go}}{R_1} - I_{10} + \eta\frac{kT_o}{qR_1}\right)\frac{\Delta T}{T_o} - \frac{1}{2}\eta\frac{kT_o}{qR_1}\left(\frac{\Delta T}{T_o}\right)^2 \qquad (27)$$

$$I_2(T) = I_{20}\left(1 + \frac{\Delta T}{T_o}\right) \qquad (28)$$

$$I_3(T) = I_{30}\left(1 + \frac{2\Delta T}{T_o} + \left(\frac{T}{T_o}\right)^2\right) \qquad (29)$$

with $$I_{20} = 2\frac{kT_o}{qR_2}\ln n$$

and $$I_{30} = \frac{6(I_{20})^2}{16I}$$

For temperature compensation the following must apply:

$$I_1 + I_2 + I_3 = I_{10} + I_{20} + I_{30}$$

or:

$$\frac{V_{go}}{R_1} - I_{10} + \eta\frac{kT_o}{qR_1} = I_{20} + 2I_{30} \qquad (30)$$

$$\frac{1}{2}\eta\frac{kT_o}{qR_1} = I_{30} \qquad (31)$$

Substitution of (31) in (30) yields the system:

$$\frac{V_{go}}{R_1} - I_{10} = I_{20} \qquad (32)$$

$$\frac{1}{2}\eta\frac{kT_o}{qR_1} = I_{30} \qquad (31)$$

Under said condition (with expression (23)) the sum of the currents $I_1 + I_2 + I_3$ becomes:

$$\frac{1}{2}I = \frac{V_{go}}{R_1} + \frac{1}{2}\eta\frac{kT_o}{qR_1} \qquad (33)$$

From expression (33) the value of the resistor $R_1$ can be determined as a function of the desired current I:

$$R_1 = \frac{2\left(V_{go} + \frac{1}{2}\eta\frac{kT_o}{q}\right)}{I} \qquad (34)$$

Measurements conducted on transistors as employed in the previously discussed circuit arrangement have revealed that $V_{go} = 1.180$ and $\eta = 3.125$. For $T_o$ 293° K is selected. Insertion of the various values in expression (34) yields:

$$R_1 = \frac{2.438}{I} \qquad (35)$$

To compensate for the first-order temperature dependence expression (32) must be satisfied. Expression (31) (second-order compensation) may be re-written as:

$$\frac{1}{2}\eta\frac{kT_o}{qR_1} = I_{30} = \frac{6}{16}\;\frac{(I_{20})^2}{I} \qquad (36)$$

When the value of $R_1$ (expression (34)) has been adjusted, expression (33) may be substituted in expression (36):

$$\frac{1}{2}\eta\frac{kT_o}{qR_1} = \frac{6}{16}\;\frac{(I_{20})^2}{\frac{2}{R_1}\left(V_{go} + \eta\frac{kT_o}{q}\right)} \qquad (37)$$

Expression (32) may be re-written as:

$$I_{20} = \frac{1}{R_1}(V_{go} - V_{beo}) \qquad (38)$$

Combination of expressions (37) and (38) yields as the condition for second-order compensation:

$$\frac{6}{16} = \frac{\left(V_{go} + \frac{1}{2}\eta\frac{kT_o}{q}\right)}{(V_{go} - V_{beo})^2}\cdot\eta\frac{kT_o}{q} \qquad (39)$$

Substitution of the values of $V_{go}$, $\eta$ and $V_{beo}$ which apply for the transistors of this circuit arrangement, and substitution of $kT_o/q$ results in the value 0.38 for the right-hand term of equation (39). This is substantially equal to 6/16 so that the circuit arrangement of FIG. 6 provides compensation for second-order temperature errors.

Adjustment now proceeds very simply. Starting from the required current I the value of resistor $R_1$ is determined with the aid of expression (35) and this resistor is adjusted accordingly. As the resistor $R_2$ has not yet the desired value, the current which flows through the terminal F will not equal the desired current. The resistor $R_2$ should now be adjusted so that the said current has the desired value. At that instant both condition (31) and condition (32) is satisfied. When varying $R_2$ a point is reached at which condition (30) is satisfied. At said point condition (31) is also satisfied and the sum of the currents equals the desired value I.

The circuits VII and VIII serve to make the current I less dependent on the voltage which is applied between terminals F and F'. Between the terminals F' and R a voltage is available which equals the sum of the base-emitter voltages of the transistors $T_{30}$, $T_{28}$, $T_{27}$, $T_{26}$, $T_{23}$ and $T_{22}$, which sum voltage approximately equals $6V_{beo}$, and which voltage is constant at a constant I. Between the terminals F' and A' there is a voltage which is equal to the sum of the base-emitter voltages of said transistors minus the base-emitter voltages of the transistors $T_{18}$ and $T_{19}$. Between the terminals F and R'a voltage is available which equals the sum of the base-emitter voltages of the transistors $T_{15}$, $T_{17}$ and $T_{20}$. Between the terminals F and G a voltage exists which equals the sum of the base-emitter voltages of the transistors $T_{15}$, $T_{17}$, $T_{20}$ and $T_{45}$ minus the base-emitter voltages of the transistors $T_{48}$ and $T_{49}$. At a constant current I the variations of the voltage between the terminals F and F' are imparted to the voltage between terminals R' and A' and the voltage between the terminals G and R. Since the circuits VII and VIII have a high impedance for voltage variations, the currents which flow through said circuits are hardly affected by the voltage variations of the supply voltage. The circuit VII consists of the known Darlington arrangement, while the circuit VIII comprises the series-connection of the transistors $T_{46}$ and $T_{47}$. The base current for the transistor $T_{47}$ is supplied by the transistor $T_{49}$. The impedance raising properties of such a circuit arrangement are known. Transistor $T_{48}$ which is connected as a diode produces a voltage difference $V_{be}$ between the base of transistor $T_{49}$ and the emitter of transistor $T_{46}$. As the circuit VII has two stable states, namely the conducting and the non-conducting state, the transistor $T_{45}$ which is connected as a diode by-passes the base-emitter junction of transistor $T_{46}$ so as to force the transistor $T_{46}$ into the conductive state. The transistor $T_{20}$ which is connected as a diode by-passes the base-collector junction of transistor $T_{46}$. The base-collector voltage of transistor $T_{46}$ equals the sum of the base-emitter voltages of the transistors $T_{48}$ and $T_{49}$ minus the base-emitter voltage of transistor $T_{46}$. The starting circuit IX realizes a current in the collector circuits of the transistors $T_{24}$ and $T_{25}$ which current equals the base current of transistor $T_{21}$. The second current source circuit II also has the non-conductive state as the stable state. The starting circuit IX assumes the conductive state in that said circuit impresses the collector currents of the transistors $T_{24}$ and $T_{25}$ on the current source circuit II at the instant that the supply voltage is applied causing transistor $T_{21}$ to conduct and draw a base current.

The circuit of FIG. 6 is compensated for the various base currents, as will be evident when the base currents in FIG. 6 are considered. The base current of transistor $T_{14}$ is compensated by the base current of transistor $T_{17}$. The base current of transistor $T_{46}$ is compensated by one of the collector currents of the transistors $T_{24}$ and $T_{25}$. The base current of transistor $T_{18}$, which forms part of the Darlington arrangement, in negligible. The current ½I is divided into two currents $I_1$ and $I_2$ at terminal A', which are of the same order of magnitude. More in particular, the current which flows through the terminal A' approximately equals half the current which flows through the terminal A. The base current of transistor $T_{27}$ is thus compensated by the base currents of the transistors $T_{26}$ and $T_{28}$.

The sum of the currents which flow through the collector-emitter paths of the transistors $T_{30}$, $T_{31}$ and $T_{32}$ equals the current which flows through the transistor $T_{21}$. The sum of the base currents of the transistors $T_{30}$, $T_{31}$ and $T_{32}$ is consequently compensated by one of the collector currents of the transistors $T_{24}$ and $T_{25}$. The sum of the base currents which flow between the current path which is formed between the terminals F, G', R', A' and F', and the current path which is formed between the terminals F, G, R, A and F' is consequently zero.

The extrapolation of $V_{go}$ in expression (3) applies to silicon transistors. For germanium transistors an expression can be derived which is similar to equation 6 in its general form, so that the invention is not limited to silicon transistors.

The circuit arrangement of FIG. 6, except for the resistors $R_1$ and $R_2$, consists of semiconductor elements so that the arrangement is highly suited to take the form of a monolithic integrated circuit.

The scope of the invention is not limited to the example of FIG. 6. Numerous modifications are possible in respect of the location and embodiment of the current mirror circuits and the impedance raising elements. For the described current source circuits and the squaring circuit, different types may be selected. For example, the transistor $T_1$ of the first current source circuit may be connected as a diode. Furthermore, the current mirror circuits V or VI may be dispensed with if a different type of squaring circuit is employed. Moreover, all transistors may be replaced by transistors of an opposite conductivity type, the directions of the currents then being reversed.

What is claimed is:

1. A current stabilizing arrangement comprising:

a. a three-terminal circuit comprising an input terminal, an output terminal, a common terminal and two parallel branches connected between the input terminal and the common terminal, one branch including the collector-emitter path of a first transistor and the other branch at least the base-emitter junction of a second transistor in series with a resistor, the collector of the second transistor being connected to said output terminal of the three-terminal network and the base of the first transistor being driven by a signal derived from the input signal in such a way that for a constant current at the input terminal a current with a negative temperature coefficient appears at the output terminal, b. a two-terminal circuit comprising first and second terminals and two parallel branches connected there between and which are coupled by means of a current dividing circuit so that the currents which flow through the two branches bear a fixed ratio to each other, at least one semiconductor junction included in the one branch and by-passed by a series connection of at least one semiconductor junction and a resistor which is included in the other branch, at least one of the two said semiconductor junctions being the base-emitter junction of a transistor, whereby between the first and second terminals of said two-terminal circuit a current with a positive temperature coefficient appears, and c. a current mirror circuit having an input terminal connected to the output terminal of said three-terminal circuit and also to the first terminal of said two-terminal circuit, means connecting the second terminal of the two-terminal circuit to the common terminal of said three-terminal circuit, and means connecting the output terminal of said current mirror circuit to the input terminal of the three-terminal circuit.

2. An arrangement as claimed in claim 1, further comprising a squaring circuit to which a current proportional to the current which flows between the terminals of said two-terminal circuit is applied, the squaring circuit having an output circuit in which a current flows which is proportional to the square of the current which flows through said two-terminal circuit and which output circuit connects the input terminal of the first current mirror circuit to the common terminal of said three-terminal circuit.

3. An arrangement as claimed in claim 2, characterized in that the output circuit of said squaring circuit includes the collector-emitter path of a first transistor whose collector is connected to the input terminal of said first current mirror circuit and whose emitter is connected to the common terminal of said three-terminal circuit, means connecting the base of the first transistor to the emitter of a second transistor and to the collector of a third transistor whose base-emitter junction by-passes the base-emitter junction of the first transistor of said three-terminal circuit and whose collector is connected to the input of said three-terminal circuit and whose base is connected to the base and the collector of a fourth transistor, the emitter of the fourth transistor being connected to the base and the collector of a fifth transistor, whose emitter is connected to the emitter of the first transistor, the collector of the fourth transistor being connected to the collector of a sixth transistor, whose base-emitter junction bypasses the base-emitter junction of a transistor which forms part of said current dividing circuit and which last-mentioned transistor carries at least a proportional part of the current which flows between the terminals of said two-terminal circuit.

4. An arrangement as claimed in claim 1, characterized in that the input circuit and the output circuit of the current mirror circuit include means providing the arrangement with a high differential impedance.

5. A current source for deriving a current that is substantially independent of temperature comprising, a current mirror circuit having an input terminal, an output terminal and a sum terminal, a three-terminal network having an input terminal, an output terminal, a common terminal and first and second branch circuits connected between the common terminal and the input and output terminals, respectively, and including a first resistor in series with a semiconductor junction in one branch and a transistor in the other branch, a two-terminal network comprising two terminals and two parallel branches connected between the two terminals thereof with current dividing means providing currents in the two branches in a fixed ratio to one another, one branch including a semiconductor junction and the other branch a series circuit including a second semiconductor junction and a second resistor connected in shunt with the semiconductor junction of said one branch whereby a current with a positive temperature coefficient appears between the two terminals of the two terminal network, means connecting the input terminal of the current mirror circuit to the output terminal of the three-terminal network and to one terminal of the two-terminal network, means connecting the other terminal of the two-terminal network to the common terminal of the three-terminal network, the sum terminal of the current mirror circuit and the common terminal of the three-terminal network forming the terminals of the current source, and means connecting the output terminal of the current mirror circuit to the input terminal of the three-terminal network whereby a constant current at said input terminal of the three-terminal network produces a current with a negative temperature coefficient at the output terminal thereof.

6. A current source as claimed in claim 6 wherein said first and second resistors are chosen to have a given relationship to one another such that the temperature-dependence of the currents flowing in the output terminal of the three-terminal network and said one terminal of the two terminal network compensate each other to provide a temperature-independent current between the terminals of the current source.

7. A current source as claimed in claim 6 wherein said one branch of the three-terminal network comprises a transistor in series with said first resistor, means connecting a control electrode of the latter transistor to one main electrode of the transistor in the other branch of the three-terminal network, and means connecting a control electrode of said other branch transistor to a junction between the first resistor and a main electrode of the transistor in said one branch.

8. A current source as claimed in claim 6 further comprising a squaring circuit having a first terminal connected to receive a current proportional to the current flowing between the terminals of said two-terminal network, the squaring circuit further comprising a second terminal coupled to the input terminal of the current mirror circuit, an output terminal coupled to the common terminal of the three-terminal network, and circuit means interconnecting said squaring circuit terminals so that a current proportional to the square of said current flowing between the terminals of said two-terminal network flows in said circuit means.

9. A current source as claimed in claim 8 wherein the squaring circuit further comprises a third terminal connected to the output terminals of the current mirror circuit.

10. A current source as claimed in claim 9 wherein the circuit means of the squaring circuit comprises, a first transistor with its emitter-collector path connected between the second terminal and the output terminal of the squaring circuit, a second transistor with its emitter-collector path connected between the third terminal and the base of the first transistor, first and second diodes serially connected between the first terminal and the output terminal of the squaring circuit, and means connecting the base electrode of said second transistor to said first terminal of the squaring circuit.

* * * * *

UNITED STATES PATENT AND TRADEMARK OFFICE
CERTIFICATE OF CORRECTION

PATENT NO. : 4,016,435
DATED : April 5, 1977
INVENTOR(S) : JOHANNES OTTO VOORMAN It is certified that error appears in the above-identified patent and that said Letters Patent are hereby corrected as shown below:

IN THE SPECIFICATION

Col. 4, line 27, "a" (second occurr.) should be --n--; and "n" should be --a--;

Col. 9, line 28, after "B" should be --is--;

Col. 12, after line 40, the expression "$\frac{(I_{20})^2}{\frac{2}{R_1}\left(V_{go} + \eta \frac{kT_o}{q}\right)}$"

should be

--$\frac{(I_{20})^2}{\frac{2}{R_1}\left(V_{go} + \frac{1}{2}\eta \frac{kT_o}{q}\right)}$--

UNITED STATES PATENT AND TRADEMARK OFFICE

CERTIFICATE OF CORRECTION

PATENT NO. : 4,016,435
DATED : April 5, 1977
INVENTOR(S) : JOHANNES OTTO VOORMAN It is certified that error appears in the above-identified patent and that said Letters Patent are hereby corrected as shown below:

IN THE CLAIMS

Claim 6, line 1, "6" should be --5--;

Claim 7, line 1, "6" should be --5--;

Claim 8, line 1, "6" should be --5--.

Signed and Sealed this

*Twenty-ninth* Day of *November 1977*

[SEAL]

*Attest:*

RUTH C. MASON
*Attesting Officer*

LUTRELLE F. PARKER
*Acting Commissioner of Patents and Trademarks*